United States Patent
Shenoy (12)

(10) Patent No.: US 7,199,442 B2
(45) Date of Patent: Apr. 3, 2007

(54) SCHOTTKY DIODE STRUCTURE TO REDUCE CAPACITANCE AND SWITCHING LOSSES AND METHOD OF MAKING SAME

(75) Inventor: Praveen M. Shenoy, Wilkes Barre, PA (US)

(73) Assignee: Fairchild Semiconductor Corporation, South Portland, ME (US)

( * ) Notice: Subject to any disclaimer, the term of this patent is extended or adjusted under 35 U.S.C. 154(b) by 80 days.

(21) Appl. No.: 10/893,764

(22) Filed: Jul. 15, 2004

(65) Prior Publication Data
US 2006/0022292 A1    Feb. 2, 2006

(51) Int. Cl.
*H01L 29/47* (2006.01)
(52) U.S. Cl. ............... 257/471; 257/73; 257/155; 257/192; 257/260; 257/476; 257/483; 438/92; 438/167
(58) Field of Classification Search ............ None
See application file for complete search history.

(56) References Cited
U.S. PATENT DOCUMENTS
6,673,662 B2 *  1/2004  Singh ............... 438/167

FOREIGN PATENT DOCUMENTS
JP    57037886 A  *  3/1982

* cited by examiner

*Primary Examiner*—Nathan J. Flynn
*Assistant Examiner*—Scott R Wilson
(74) *Attorney, Agent, or Firm*—Hiscock & Barclay, LLP; Thomas R. FitzGerald, Esq.

(57) ABSTRACT

A SiC Schottky barrier diode (SBD) is provided having a substrate and two or more epitaxial layers, including at least a thin, lightly doped N-type top epitaxial layer, and an N-type epitaxial layer on which the topmost epitaxial layer is disposed. Multiple epitaxial layers support the blocking voltage of the diode, and each of the multiple epitaxial layers supports a substantial portion of the blocking voltage. Optimization of the thickness and dopant concentrations of at least the top two epitaxial layers results in reduced capacitance and switching losses, while keeping effects on forward voltage and on-resistance low. Alternatively, the SBD includes a continuously graded N-type doped region whose doping varies from a lighter dopant concentration at the top of the region to a heavier dopant concentration at the bottom.

27 Claims, 8 Drawing Sheets

| SubWafer # | Epithk1 um | Epithk2 um | Ndop1 /cm3 | Ndop2 /cm3 | VfR400 V | BV V | Cak0V F/um | Cak300V F/um | Qrr nC | Qa nC | Qb nC | Qtail nC | Irrmax A | Comments |
|---|---|---|---|---|---|---|---|---|---|---|---|---|---|---|
| 1 | 4 | | 1.8E+16 | | 1.155 | 813 | 3.47E-16 | 2.03E-17 | 50.08 | 23.40 | 11.20 | 15.40 | -3.72 | Control |
| 2 | 1 | 4 | | | 1.224 | 790 | 1.46E-16 | 2.00E-17 | 40.84 | 20.00 | 9.36 | 11.50 | -3.31 | |
| 3 | 2 | 4 | | | 1.320 | 916 | 1.46E-16 | 1.86E-17 | 35.93 | 16.36 | 8.65 | 10.93 | -2.95 | Second lowest TL at 200KHz |
| 4 | 1 | 4.5 | 3.0E+15 | 1.8E+16 | 1.234 | 825 | 1.46E-16 | 1.99E-17 | 41.04 | | | | -3.31 | |
| 5 | 2 | 4.5 | | | 1.329 | 943 | 1.46E-16 | 1.84E-17 | 35.89 | | | | -2.95 | |
| 6 | 1 | 5 | | | 1.243 | 851 | 1.46E-16 | 1.96E-17 | 41.04 | | | | -3.31 | |
| 7 | 2 | 5 | | | 1.338 | 961 | 1.46E-16 | 1.85E-17 | 35.88 | | | | -2.95 | |
| 8 | 1 | 4 | | | 1.187 | 787 | 1.87E-16 | 2.01E-17 | 42.13 | | | | -3.38 | |
| 9 | 2 | 4 | | | 1.246 | 906 | 1.87E-16 | 1.86E-17 | 35.98 | 17.58 | 8.67 | 9.74 | -3.05 | |
| 10 | 1 | 4.5 | 5.0E+15 | 1.8E+16 | 1.196 | 821 | 1.87E-16 | 1.99E-17 | 42.11 | | | | -3.38 | |
| 11 | 2 | 4.5 | | | 1.255 | 931 | 1.87E-16 | 1.89E-17 | 37.88 | 17.57 | 8.67 | 11.66 | -3.05 | |
| 12 | 1 | 5 | | | 1.205 | 846 | 1.87E-16 | 1.96E-17 | 42.12 | 20.20 | 9.98 | 11.90 | -3.38 | |
| 13 | 2 | 5 | | | 1.264 | 947 | 1.87E-16 | 1.86E-17 | 37.91 | | | | -3.05 | |
| 14 | 1 | 4 | | | 1.169 | 784 | 2.20E-16 | 2.01E-17 | 42.92 | 20.40 | 10.40 | 12.10 | -3.42 | |
| 15 | 2 | 4 | | | 1.212 | 894 | 2.20E-16 | 1.88E-17 | 37.80 | 18.00 | 9.46 | 10.34 | -3.15 | |
| 16 | 1 | 4.5 | 7.0E+15 | 1.8E+16 | 1.178 | 817 | 2.20E-16 | 1.99E-17 | 42.78 | | | | -3.42 | |
| 17 | 2 | 4.5 | | | 1.221 | 918 | 2.20E-16 | 1.90E-17 | 37.81 | 18.00 | 9.46 | 10.34 | -3.15 | |
| 18 | 1 | 5 | | | 1.187 | 842 | 2.20E-16 | 1.96E-17 | 42.77 | | | | -3.42 | |
| 19 | 2 | 5 | | | 1.231 | 933 | 2.20E-16 | 1.91E-17 | 37.82 | | | | -3.15 | |
| 20 | 6; linear | | 3.0E+15 | 1.8E+16 | 1.268 | 976 | 1.65E-16 | 1.63E-17 | 32.26 | 14.96 | 8.28 | 9.02 | -2.81 | Lowest total loss at 200KHz |
| 21 | 4 steps of 1.5 | | 3.0E+15 | 1.8E+16 | 1.268 | 977 | 1.84E-16 | 1.63E-17 | 32.19 | 14.97 | 8.25 | 8.97 | -2.81 | Lowest total loss at 200KHz |

SCHOTTKY DIODE STRUCTURE TO REDUCE CAPACITANCE AND SWITCHING LOSSES AND METHOD OF MAKING SAME

TECHNICAL FIELD

This invention relates in general to the structure and manufacturing of diodes and, in particular, to the structure and manufacturing of silicon carbide Schottky barrier diodes.

BACKGROUND OF THE INVENTION

Silicon carbide (SiC) is an attractive semiconductor material for power devices due to its excellent material properties. The high critical electric field strength makes SiC advantageous for unipolar devices with low on-resistance (Ron). SiC Schottky barrier diodes (SBDs) in the >600V rating are becoming popular. Minimal reverse recovery losses are among the advantages provided by these high voltage (HV) SBDs over conventional silicon PiN diodes. For these HV SBDs, there is no minority stored charge loss; main losses are due to the capacitance charge of the SBD. Other advantages provided by HV SBDs include a high junction temperature rating, and low forward voltage (Vf) and positive temperature coefficient that allows easy paralleling. Thus SiC SBDs are attractive for high frequency applications, which are typically greater than 100 KHz. In these applications, the switching losses dominate. Since total switching loss is proportional to frequency×Esw, where Esw is switching energy loss, a reduction in Esw is attractive. Esw can be reduced by, for example, decreasing the capacitive charge (Qc) and the peak reverse recovery current (Irrmax).

Conventional SiC SBDs use a single epitaxial layer to support the blocking voltage. The doping and thickness of this single epitaxial layer are selected based on the rated breakdown voltage and a best Ron value. Thus, for a selected breakdown voltage, the doping is almost fixed, and capacitance of the SBD is dependent upon the doping concentration. For example, in the conventional reverse bias case, a higher doping concentration means a thinner depletion layer, and results in an increased capacitance of the diode. This conventional design results in high capacitance, especially at low reverse voltages. High capacitance results in relatively high Qc and Irrmax, thereby increasing switching losses. Conventional SiC SBDs include, for example, a 4A/600V SiC SBD (CSD04060) offered by Cree, Inc. of Durham, N.C.

Figure 1:
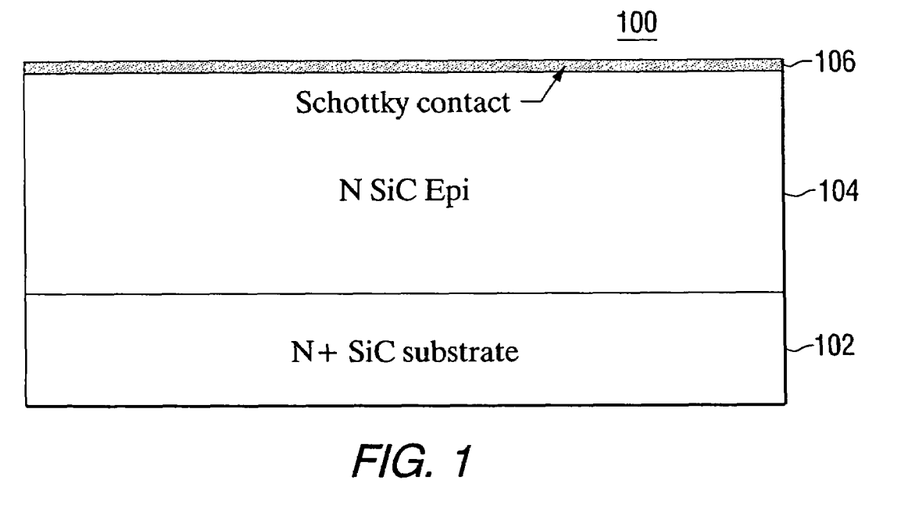
FIG. 1 depicts a cross-section of a prior art Schottky barrier diode (SBD) having a single epitaxial silicon carbide layer.
Figure 2:
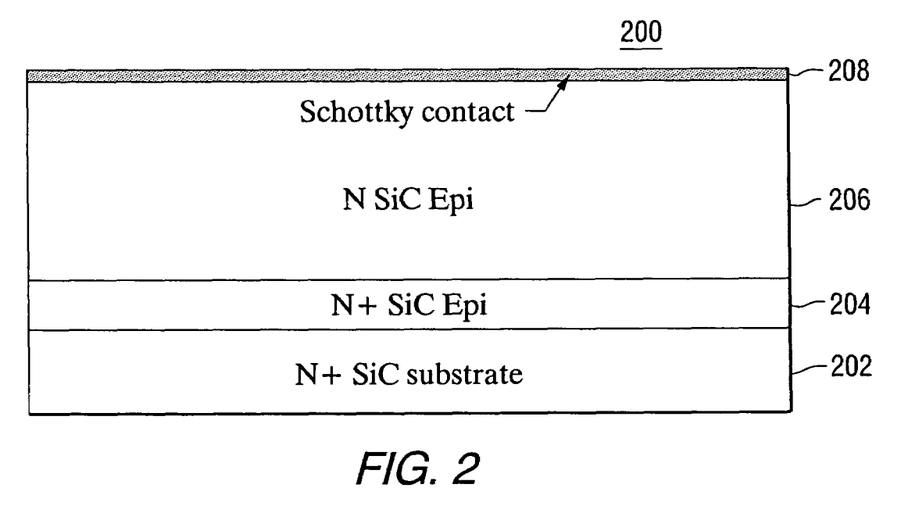
FIG. 2 depicts a cross-section of a prior art SBD having two epitaxial silicon carbide layers.

As depicted in FIG. 1, a conventional SiC SBD 100 structure includes an N+ (highly doped) SiC substrate 102, a single N-type epitaxial layer 104 disposed on substrate 102, and a metal Schottky contact 106 disposed on epitaxial layer 104. In FIG. 2, a conventional SBD 200 with two epitaxial layers is depicted having an N+ SiC substrate 202, an N+ SiC epitaxial layer 204 disposed on substrate 202, N-type SiC epitaxial layer 206 disposed on N+ epitaxial layer 204, and a Schottky contact 208 disposed on N-type epitaxial layer 206. In FIGS. 1 & 2, almost all of the blocking voltage is supported by the topmost N epitaxial layer. N+ epitaxial layer 204 positioned below N-type epitaxial layer 206 supports a non-substantial amount of voltage, and it is typically used to prevent the electric field from reaching the substrate.

In these cases (FIGS. 1 & 2), the reverse recovery losses are determined by the doping concentration and the thickness of topmost N-type epitaxial layer 104 (FIG. 1), 206 (FIG. 2). The capacitance and Qc can be lowered by reducing the doping concentration of the top epitaxial layer, or adjusting the doping and thickness of the top epitaxial layer. These modifications can lower Qc and Irrmax, and thus reduce switching losses in the diode and the associated switch. Lighter surface doping also reduces leakage currents. However, such an adjustment to the top epitaxial layer of conventional SiC SBDs increases the on-resistance (Ron) and forward voltage (Vf), as well as creating fragile breakdown (i.e., low Unclamped Inductive Switching (UIS) capability).

Based on the foregoing, a need still exists for an improved SiC SBD structure to reduce capacitance and switching losses while resulting in only small effects on Ron and Vf.

SUMMARY OF THE INVENTION

The shortcomings of the prior art are overcome and additional advantages are provided through the provision in one aspect of a semiconductor device. The semiconductor device includes, for instance, a highly doped N-type SiC substrate; an N-type SiC first epitaxial layer disposed on the substrate, the first epitaxial layer having a first dopant concentration; and a lightly doped N-type SiC second epitaxial layer disposed on the first epitaxial layer, the second epitaxial layer having a second dopant concentration. The second dopant concentration is less than the first dopant concentration. The first epitaxial layer and the second epitaxial layer each support a substantial portion of blocking voltage of the semiconductor device. As one example, the semiconductor device is a Schottky barrier diode.

In a further aspect of the present invention, a semiconductor device is provided that includes, for example, a highly doped N-type SiC substrate; an N-type SiC bottom epitaxial layer disposed on the substrate, the bottom epitaxial layer having a first dopant concentration; one or more N-type SiC intermediate epitaxial layers positioned superior to the substrate, wherein one layer of the one or more intermediate epitaxial layers is an upper layer and one layer of the one or more intermediate epitaxial layers is a lower layer. Of the intermediate layers, the upper layer is positioned furthest from the substrate, and the lower layer is disposed on the substrate. The semiconductor device further includes an N-type SiC top epitaxial layer disposed on the upper layer of the one or more intermediate layers, the top epitaxial layer having a second dopant concentration. At least two epitaxial layers each support a substantial portion of blocking voltage of the semiconductor device. The second dopant concentration is less than the first dopant concentration and less than dopant concentrations of the one or more intermediate epitaxial layers. As an example, the semiconductor device is a Schottky barrier diode.

In a still further aspect of the present invention, a semiconductor device is provided that includes, for instance, a highly doped N-type SiC substrate and an N-type SiC epitaxial layer disposed on the substrate. The epitaxial layer has a continuously graded dopant concentration that varies according to a distance from the substrate. The dopant concentration varies from a lowest concentration at a distance furthest from the substrate to a highest concentration at a distance closest to the substrate.

Methods of manufacturing corresponding to the above-summarized semiconductor devices are also described and claimed herein.

Various features and advantages are realized through the techniques of the present invention. Other embodiments and aspects of the invention are described in detail herein and are considered a part of the claimed invention.

BRIEF DESCRIPTION OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

DETAILED DESCRIPTION

In accordance with an aspect of the present invention, an enhanced semiconductor device is provided for reducing capacitance and switching losses while keeping the effects on Vf and Ron negligible. As one example, the semiconductor device is a Schottky barrier diode (SBD) employing a silicon carbide substrate, an N-type SiC first epitaxial layer disposed on the substrate, and an N− SiC second epitaxial layer disposed on the first epitaxial layer. The second epitaxial layer has a lower dopant concentration than the first epitaxial layer. The second epitaxial layer is also preferably thinner than the first epitaxial layer. Dopant concentrations and thickness dimensions of the epitaxial layers are selected so that each epitaxial layer supports a substantial portion of the SBD's blocking voltage, and so that the capacitance and total loss of the SBD are reduced compared to conventional SBDs. The total loss improvement is even greater at higher frequencies, making the present invention particularly attractive for high frequency (e.g., 200–300 KHz) devices, such as power supplies used in personal computers and other electronic appliances.

Figure 3A:
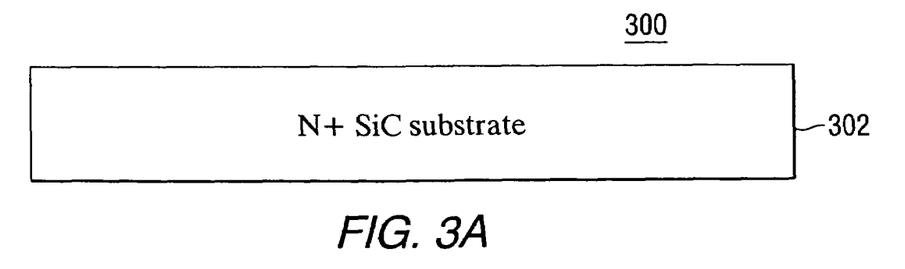
FIG. 3A depicts, in a cross-sectional view, a silicon carbide substrate to be employed in a SBD, and N+ dopant being applied to the substrate, in accordance with one or more aspects of the present invention.
Figure 3B:
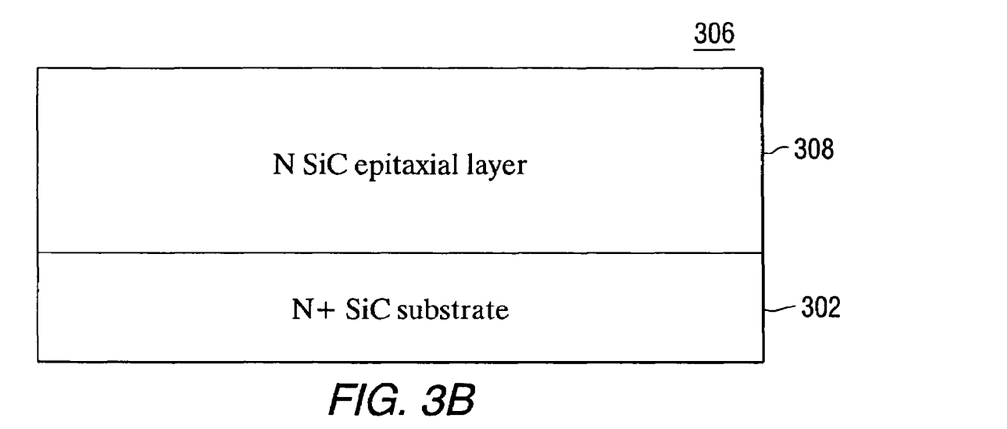
FIG. 3B depicts, in a cross-sectional view, one embodiment of a first silicon carbide epitaxial layer grown on the silicon carbide substrate of FIG. 3, and N-type dopant being applied to the first epitaxial layer, in accordance with one or more aspects of the present invention.
Figure 3C:
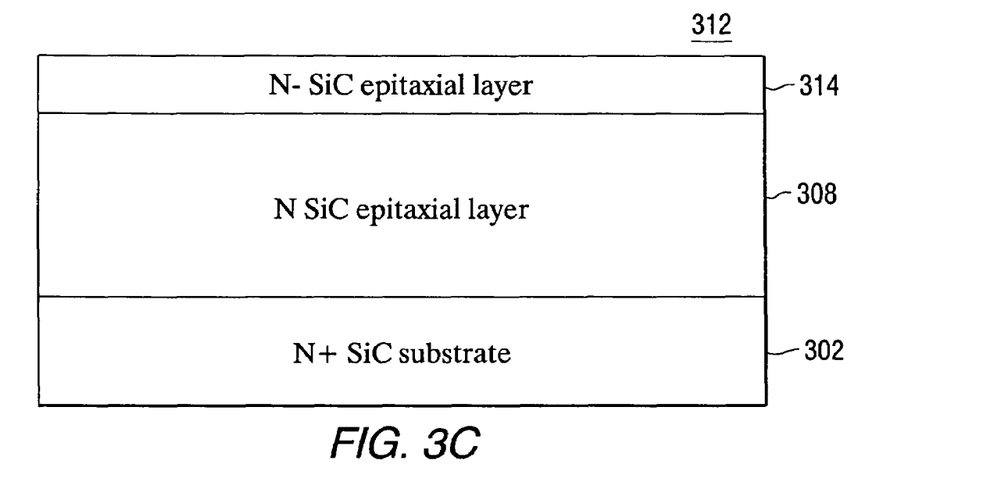
FIG. 3C depicts, in a cross-sectional view, one embodiment of a second silicon carbide epitaxial layer grown on the first epitaxial layer of FIG. 4, and N-dopant being applied to the second epitaxial layer, in accordance with one or more aspects of the present invention.
Figure 3D:
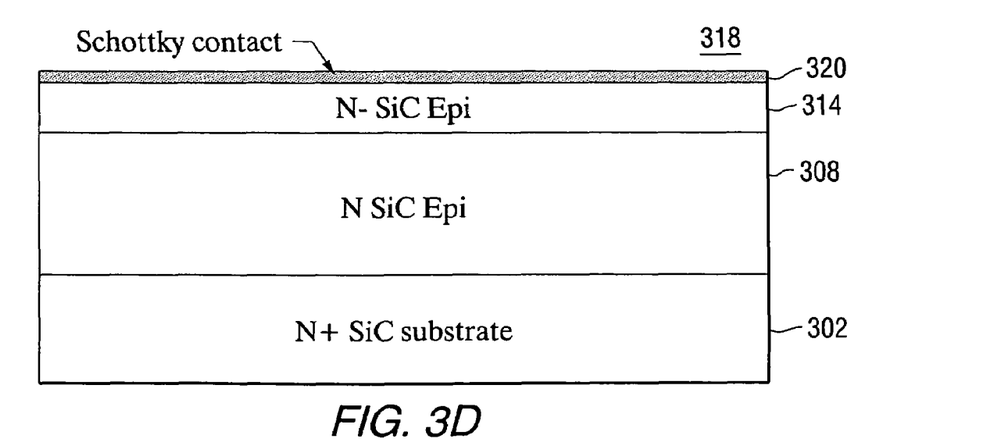
FIG. 3D depicts, in a cross-sectional view, one embodiment of a completed SBD having the substrate of FIG. 3A, the two epitaxial layers shown in FIGS. 3B & 3C, and a metal Schottky contact, in accordance with one or more aspects of the present invention.

One embodiment of an SBD incorporating and using one or more aspects of the present invention is depicted in FIG. 3D, and a method of manufacturing SBD 318 of FIG. 3D is depicted in FIGS. 3A–3C. In FIG. 3A, a first step 300 of manufacturing SBD 318 includes providing SiC substrate 302, which is subjected to a conventional doping technique to provide substrate 302 with N+ doping. As depicted in FIG. 3B, second step 306 of manufacturing SBD 318 includes SiC substrate 302 of N+ conductivity, and a first SiC epitaxial layer 308 grown on substrate 302. N-type doping is applied to first epitaxial layer 308. In FIG. 3C, a third step 312 of manufacturing SBD 318 is depicted. Step 312 results in a portion of a SBD that includes N+ SiC substrate 302, N-type SiC first epitaxial layer 308 disposed on substrate 302, and a SiC second epitaxial layer 314 grown on first epitaxial layer 308. Light doping (N− doping) is applied to second epitaxial layer 314. The above-described doping steps are applied during the growth of the corresponding epitaxial layer.

Figure 6:
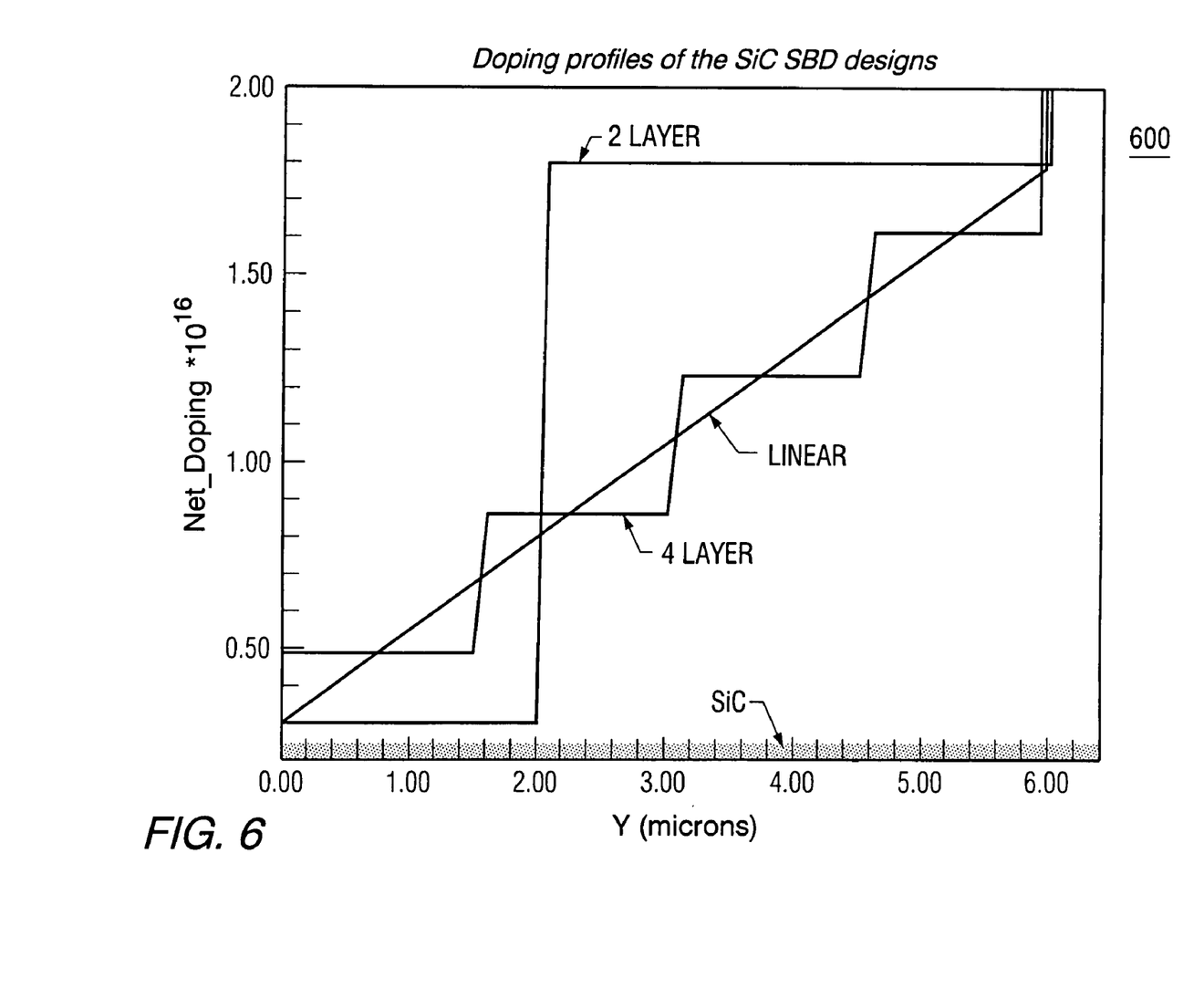
FIG. 6 depicts doping profiles of the two epitaxial layer SBD depicted in FIG. 3D, the four epitaxial layer SBD depicted in FIG. 5, and a linear design of a SBD having continuously graded doping, in accordance with one or more aspects of the present invention.
Figure 7:
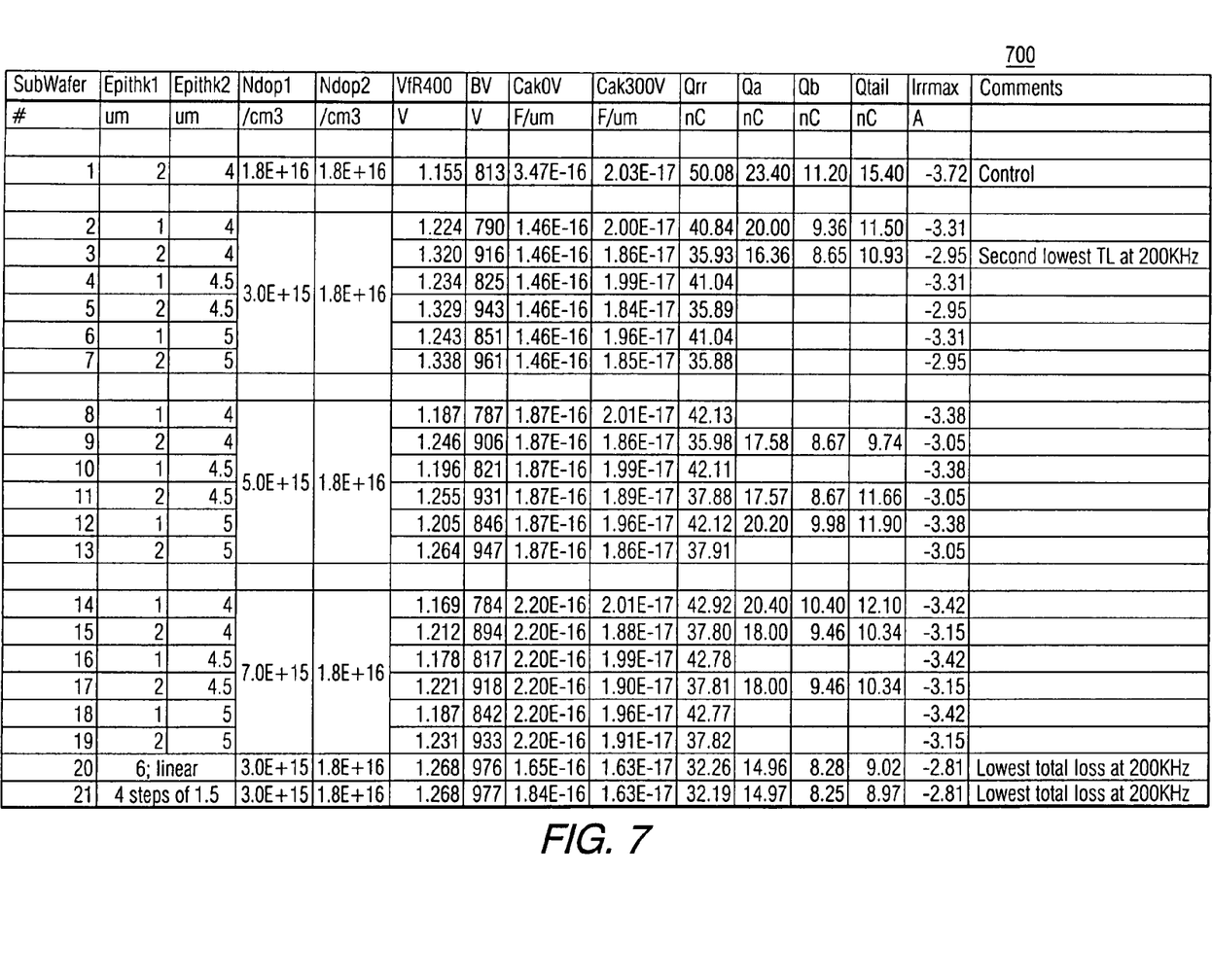
FIG. 7 depicts a table of simulated results relative to loss, comparing a conventional one epitaxial layer SBD to eighteen designs of the two epitaxial layer SBD depicted in FIG. 3D, the linear SBD design of FIG. 6, the four epitaxial layer SBD depicted in FIG. 5, and a non-linear SBD design, in accordance with one or more aspects of the present invention.

Finally, FIG. 3D depicts completed SBD 318. SBD 318 includes N+ SiC substrate 302, first and second epitaxial layers 308, 314 (as described above relative to FIG. 3C), and a metal Schottky contact 320 disposed on second epitaxial layer 314. Substrate 302 is highly doped, so that, for example, its dopant concentration is greater than the dopant concentration of either epitaxial layer 308, 314. The thickness of second epitaxial layer 314 is preferably thinner than epitaxial layer 308. As an example, the ratio of the thickness of second epitaxial layer 314 to first epitaxial layer 308 is 1:2 (e.g., 2 µm:4 µm). Examples of other thickness dimensions and ratios are shown in FIG. 7. The thickness of second epitaxial layer 314 is selected to be small (e.g., approximately 1 µm to 2 µm) so that the resulting effect on Ron and Vf is low. Further, the second epitaxial layer 314 is lightly doped and its dopant concentration is low relative to first epitaxial layer 308. As one example, the ratio of dopant concentration of second epitaxial layer 314 to first epitaxial layer 308 is 1:6 (e.g., $3.0 \times 10^{15}$ atoms/cm$^3$ to $1.8 \times 10^{16}$ atoms/cm$^3$). The doping profile associated with these thickness and doping examples is depicted in FIG. 6 (i.e., the two layer case of doping profiles 600). The present invention includes other dopant concentrations and concentration ratios for the epitaxial layers of the SBD, and examples of such concentrations and ratios are shown in FIG. 7. The dopant concentration of second epitaxial layer 314 is selected to be low to reduce capacitance at low voltages (i.e., when capacitance is typically highest). This reduction in capacitance reduces the reverse recovery losses in the diode and the turn-on losses in the switch. By optimizing the thickness dimensions and doping concentrations of first and second epitaxial layers 308, 314, total losses (switching and conduction losses) can be minimized. An example of optimal thickness dimensions and doping concentrations is described below relative to FIG. 7.

In completed SBD 318, each epitaxial layer 308, 314 supports a substantial portion of the blocking voltage of the diode. For instance, each epitaxial layer 308, 314 supports 50% of the blocking voltage. As another example, first epitaxial layer 308 supports 30% of the blocking voltage, while second epitaxial layer 314 supports 70% of the blocking voltage. These percentages of blocking voltage supported by the two epitaxial layers of SBD 318 are merely exemplary, and other percentages that are substantial portions of the blocking voltage are contemplated by the present invention. The substantial portion of blocking voltage supported by each of multiple epitaxial layers in the present invention differs from a conventional SBD, in which only a single topmost epitaxial layer supports all or almost all of the blocking voltage.

Epitaxial layers 308, 314 can be formed as separate epitaxy growth steps in a process of manufacturing SBD 318, or alternatively, these layers can be grown as part of a single epitaxy growth step. The cost of growing an epitaxial layer represents about 30% of the total cost of manufacturing a wafer. If layers 308, 314 are formed in separate steps, the cost of the epitaxial growth typically doubles, thereby increasing the total wafer cost by about 30%. Advantageously, forming layers 308, 314 as part of the same growth step has little impact on the total manufacturing cost.

Figure 4:
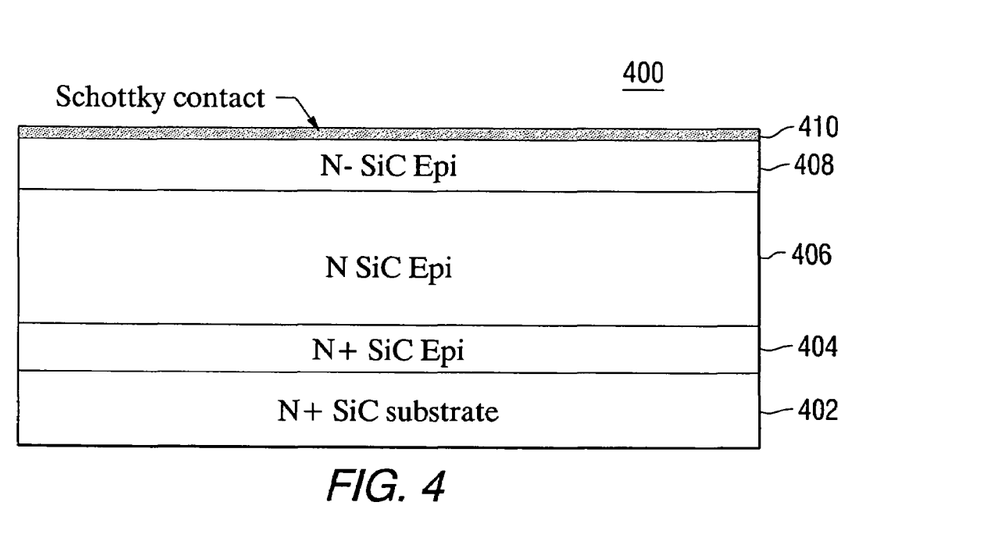
FIG. 4 depicts, in a cross-sectional view, one embodiment of a completed SBD having three epitaxial layers, in accordance with one or more aspects of the present invention.

Another embodiment of an SBD incorporating and using one or more aspects of the present invention is depicted in FIG. 4. SBD 400 in FIG. 4 includes a N+ SiC substrate 402, a N+ SiC epitaxial layer 404 disposed on substrate 402, N-type SiC epitaxial layer 406 disposed on N+ SiC epitaxial layer 404, N− SiC epitaxial layer 408 disposed on N-type SiC epitaxial layer 406, and a metal Schottky contact 410 disposed on N− SiC epitaxial layer 408. Layer 408 is the lightest doped epitaxial layer. Compared to SBD 318 of FIG. 3D, SBD 400 includes an additional epitaxial layer 404, which has a high dopant concentration. As in the case of the two epitaxial layer SBD (FIG. 3D), each epitaxial layer 404, 406, 408 is doped during growth. Each of at least the two topmost epitaxial layers 406, 408 supports a substantial portion of the blocking voltage of SBD 400. In one example, three epitaxial layers 404, 406, 408 each support a substantial portion (e.g., one-third) of the blocking voltage of SBD 400.

Figure 5:
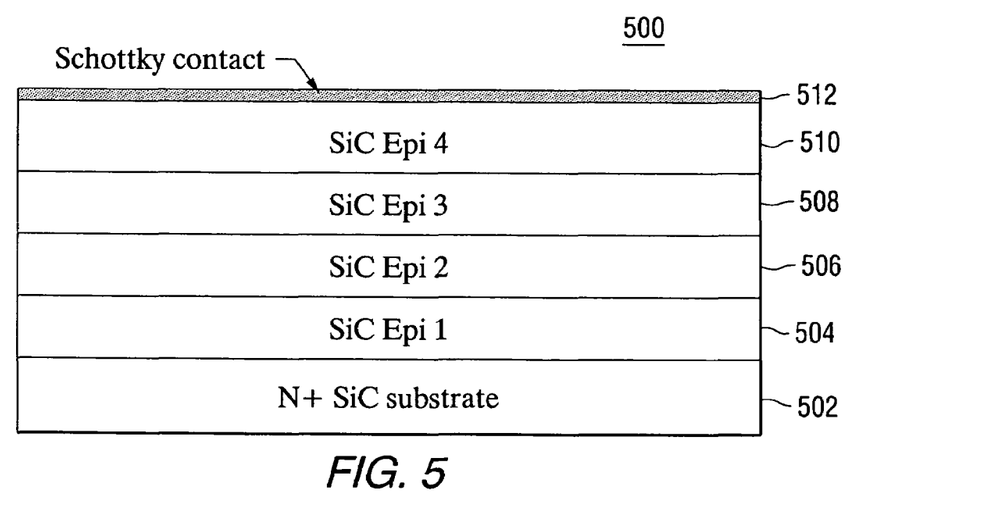
FIG. 5 depicts, in a cross-sectional view, one embodiment of a completed SBD having four epitaxial layers, in accordance with one or more aspects of the present invention.

One skilled in the art will understand that other embodiments of the present invention are possible by disposing one or more SiC epitaxial layers between epitaxial layer 404 and substrate 402, wherein the one or more additional SiC epitaxial layers each support a substantial portion of the blocking voltage of the SBD. In these other embodiments having additional epitaxial layers, the dopant levels of the epitaxial layers increase from the epitaxial layer nearest the upper surface (i.e., nearest the Schottky contact) to the epitaxial layer nearest the substrate. For example, FIG. 5 depicts a four epitaxial layer SBD 500 including N+ SiC substrate 502, first SiC epitaxial layer 504, second SiC epitaxial layer 506, third SiC epitaxial layer 508, fourth SiC epitaxial layer 510 and Schottky contact 512. The epitaxial layers are formed and doped by the processes described above relative to FIGS. 3D and 4. The dopant levels of the epitaxial layers vary in step-like fashion from the lowest doped epitaxial layer 510, which is nearest the upper surface of SBD 500, to the highest doped epitaxial layer 504, which is nearest substrate 502. The four layer case of doping profiles 600 of FIG. 6 depict the dopant levels and the step-like increase in dopant levels in SBD 500. As in the case of the two epitaxial layer SBD, the thickness of the epitaxial layers in FIGS. 4 & 5, and/or the dopant ratios between the epitaxial layers in FIGS. 4 & 5 may be varied while retaining the advantages of the present invention. Each epitaxial layer 504, 506, 508, 510 supports a significant portion of the blocking voltage of SBD 500.

As another alternative embodiment, an SBD with the beneficial effects of SBD 318 can be formed by continuously grading an epitaxial layer, which is disposed on a N+ SiC substrate, with the lowest doped portion at the top of the layer. A Schottky contact may be disposed on the epitaxial layer. One example is a continuously graded SBD, wherein the dopant level varies linearly over a 6-micron thickness of an epitaxial region of the SBD. This example includes dopant levels varying in a linear manner from $3.0 \times 10^{15}$ atoms/cm$^3$ near the upper surface of the epitaxial region (e.g., at a depth of 0.00 microns) to $1.8 \times 10^{16}$ atoms/cm$^3$ at the bottom of the epitaxial region (e.g., at a depth of 6.00 microns). Doping profiles 600 depicted in FIG. 6 include this continuously graded example (i.e., the linear case in FIG. 6). Hereinafter, this type of continuously graded SBD is referred to as the linear case or the linear design. Other examples of SBDs utilizing the linear design may use different dopant levels and/or a different thickness of the epitaxial region described above. For instance, a linear case can include a SBD with a dopant level less than $3.0 \times 10^{15}$ atoms/cm$^3$ at the upper surface of the epitaxial region and/or a dopant level greater than $1.8 \times 10^{16}$ atoms/cm$^3$ at the bottom of the epitaxial region. Further, a linear case can include an epitaxial region whose thickness is greater or less than 6.00 microns.

Although not shown in FIG. 6, SBDs with continuously graded, non-linear doping profiles that include the lowest doped portion at the top of an epitaxial layer are contemplated as alternate embodiments of the present invention and provide the benefits described herein relative to SBD 318. For example, an SBD with a non-linear design includes an epitaxial layer whose dopant concentration varies non-linearly from the upper surface of the epitaxial layer to the bottom of the epitaxial layer (i.e., the portion closest to the substrate). As a preferred embodiment of a continuously graded, non-linear design, the dopant concentration of the SBD epitaxial layer varies with the square of the distance from the upper surface of the epitaxial layer to the bottom of the layer (i.e., varies by a square law). Considering distance in the opposite direction (from the epitaxial layer portion nearest the substrate to the upper surface of the epitaxial layer), the dopant concentration of the epitaxial layer in this non-linear design example varies inversely with the square of the distance from the substrate (i.e., varies by an inverse square law).

FIGS. 7–10 summarize two dimensional numerical and mixed mode simulations performed to verify the present invention. FIG. 7 depicts a table 700 comparing simulated results related to total losses (TL) of two-epitaxial layer SBD 318 (FIG. 3D) and conventional SBD 100 (FIG. 1) (a.k.a. the control). Total loss is conduction loss+switching loss. Conduction loss equals I×Vf×d, where I is current, Vf is the forward drop at I, and d is the duty ratio (i.e., the fraction of time the diode stays on). Switching loss equals Vbus×Qc×f, where Vbus is the bus voltage for switching, Qc is the capacitive charge, and f is the frequency.

The control case is design 1 in the "SubWafer" column of FIG. 7 and various combinations of thickness dimensions and dopant concentrations for SBD 318 are listed as designs 2–19. Design 20 is the linear case described above, design 21 is the four epitaxial layer case depicted in FIG. 5, and design 22 is an approximation of the non-linear example described above (the square law or inverse square law case). For designs 2–19, FIG. 7 includes dopant concentration column Ndop1 for second epitaxial layer 314 and Ndop2 for first epitaxial layer 308. Table 700 includes a dopant concentration of $1.8 \times 10^{16}$ atoms/cm$^3$ for first epitaxial layer 308 paired with three dopant concentrations for second epitaxial layer 314 (i.e., $3.0 \times 10^{15}$ atoms/cm$^3$, $5.0 \times 10^{15}$ atoms/cm$^3$, and $7.0 \times 10^{15}$ atoms/cm$^3$). For each of these three dopant pairs, various combinations of thickness dimensions are included in the Epithk1 (for second epitaxial layer 314) and Epithk2 (for first epitaxial layer 308) columns of table 700. These various thickness dimension pairings for second epitaxial layer 314 and first epitaxial layer 308 include: 1 μm, 2 μm; 2 μm, 4 μm; 1 μm, 4.5 μm; 2 μm, 4.5 μm; 1 μm, 5 μm; and 2 μm, 5 μm, where each pair is in the format: layer 314, layer 308. Although these thickness pairings in table 700 are in first layer to second layer ratios ranging from approximately 2:1 to approximately 5:1, other thickness ratios can provide the advantages of the invention disclosed herein. For example, thickness ratios greater than approximately 5:1 are contemplated by the present invention. Similarly, although table 700 includes first layer to second layer dopant concentration ratios (a.k.a. "dopant ratio") of approximately 2:1 to approximately 6:1, other dopant ratios are included in the present invention. For instance, if the dopant ratio is at least approximately 6:1, or between 1:1 and 2:1, the advantageous lowering of total loss can be achieved.

The dopant concentrations and thickness dimensions for the linear case and the four layer case (designs 20 and 21) are shown in FIG. 6. Again, the linear case includes continuously graded doping over a region 6 microns thick, and the dopant concentrations vary linearly from $3.0 \times 10^{15}$ atoms/cm$^3$ at the top of the region to $1.8 \times 10^{16}$ atoms/cm$^3$ at the bottom (i.e., the portion nearest the substrate). The four layer case in FIG. 6 includes four epitaxial layers, each layer being 1.5 microns thick. Starting with the layer furthest from the substrate, the dopant concentrations (in atoms/cm$^3$) of the layers in the four layer case are $4.88 \times 10^{15}$, $8.63 \times 10^{15}$, $1.24 \times 10^{16}$, and $1.61 \times 10^{16}$. In design 22, the approximation of the non-linear example described above utilizes four steps with dopant concentrations (in atoms/cm$^3$) of $3.94 \times 10^{15}$, $6.75 \times 10^{15}$, $1.14 \times 10^{16}$, and $1.80 \times 10^{16}$.

Other columns in table 700 include the forward voltage of the diode at room temperature and with a current density of 400 amps (VfR400); breakdown voltage (BV); capacitance between anode and cathode at 0 volts and 300 volts of reverse voltage (Cak0V and Cak300V); reverse recovery charges relative to areas of regions formed by a reverse recovery waveform for each design (Qrr, Qa, Qb, Qtail); and reverse recovery at peak current (Irrmax). Qrr (i.e., Qc) is equal to Qa+Qb+Qtail. The total loss ranking of each design depends primarily on Irrmax, and is also dependent upon the capacitive charge and VfR400.

Design 3 in table 700 is identified as having the third lowest total loss at 200 KHz, due to its lower Qc and Irrmax. Comparing design 3 to the control, design 3's usage of a 2 μm thin top epitaxial layer 314 with 6× lower doping results in the following approximate reductions: capacitance at 0V (Cak0V) by more than 50%, capacitive charge by approximately 30%, and Irrmax by approximately 20%. The VfR400 value of design 3 is higher (less favorable) than the control, but this difference (i.e., Vf penalty) is low (i.e., only approximately 0.16V). The lower Irrmax for designs 2–19 reduces the turn-on losses in the switch compared to the control. Thus, the lower losses in the diode and switch results in SBD 318 running cooler and with increased reliability. Alternatively, the die size or heat sink can be reduced while the temperature performance of SBD 318 remains the same.

The BV of each of the enhanced designs 2–19 in table 700 is greater than the BV of the control. In conventional SBDs, a higher BV corresponds to a higher total loss. Thus, if the BV of the present invention is reduced to match the BV of the control, the above-described improvements of SBD 318 would be even greater.

Designs 20 (linear case) and design 21 (four epitaxial layer case) of table 700 provide the second lowest total losses at 200 KHz. Compared to the control case, these designs result in the following approximate reductions: capacitance at 0V (Cak0V) by approximately 52% (design 20) and 47% (design 21), capacitive charge by approximately 35%, and Irrmax by approximately 24%. The Vf penalty for design 20 or 21 is a relatively low (i.e., approximately 0.11V). Design 22 (non-linear, inverse square law case) of table 700 provides the lowest total loss at 200 KHz, with approximate reductions of 52% in Cak0V, 41.5% in capacitive charge, and 28% in Irrmax, as compared to the control case. The Vf penalty for design 22 is approximately 0.145V. The advantages discussed above relative to designs 2–19 also apply to designs 20, 21, and 22.

Figure 8:
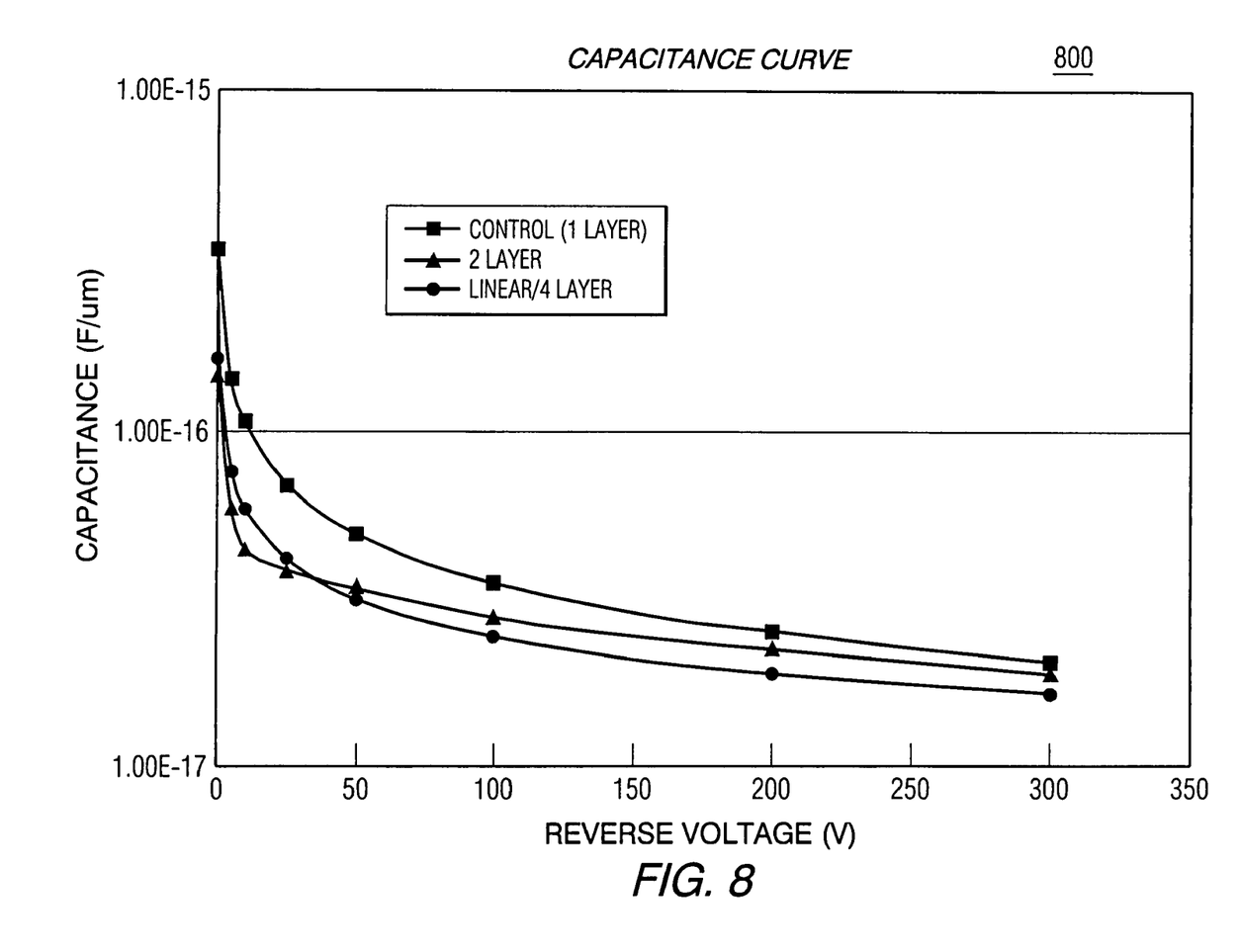
FIG. 8 depicts a capacitance vs. reverse voltage curve for a conventional one epitaxial layer SBD (FIG. 1), the two epitaxial layer SBD depicted in FIG. 3D, the four epitaxial layer SBD design depicted in FIG. 5, and the linear SBD design of FIG. 6, in accordance with one or more aspects of the present invention.

FIG. 8 depicts capacitance curves 800 mapping capacitance as a function of reverse voltage for conventional SBD 100 (FIG. 1; control SBD of FIG. 7), two epitaxial layer SBD 318 (FIG. 3D), four epitaxial layer SBD 500, and the linear case SBD described above. Since the capacitance curves for the four epitaxial layer case and the linear case are approximately equivalent, they are shown as one curve in FIG. 8 (i.e., the linear/four layer case). As depicted in FIG. 8, from 0V to 300V, the capacitance for SBD 318 is less than the capacitance of the control case. For example, at 0V reverse voltage, when capacitance is highest, SBD 318 reduces capacitance by more than a factor of two as compared to the control. As reverse voltage increases to 300V, the amount of reduction of capacitance resulting from SBD 318 decreases. Again, this reduction in capacitance provided by SBD 318 is due to the usage of lightly doped top epitaxial layer 314. As shown in FIG. 8, reductions in capacitance compared to the control are also provided by the linear/four layer case. For reverse voltages greater than or equal to approximately 50 volts, the linear/four layer case provides lower capacitance than two epitaxial layer SBD 318. The lower capacitance associated with the linear case is due to the lightest doping being at the top of the continuously graded region (i.e., furthest from the SiC substrate). Similarly, the lower capacitance associated with the four layer case results from the lightest doped epitaxial layer being the topmost epitaxial layer (i.e., the epitaxial layer furthest from the substrate).

Figure 9:
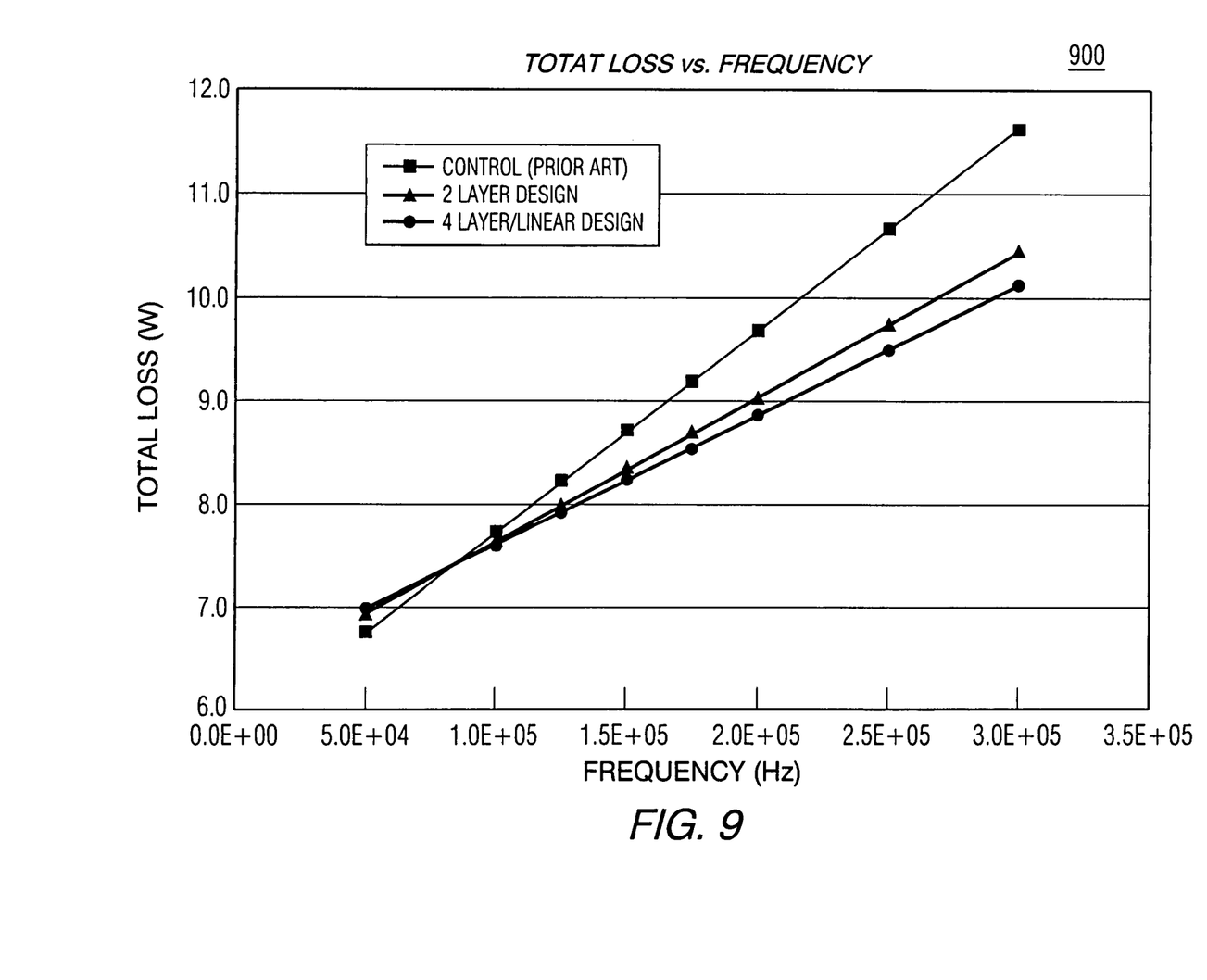
FIG. 9 depicts a total loss vs. frequency curve for a conventional one epitaxial layer SBD depicted in FIG. 1, the two epitaxial layer SBD design depicted in FIG. 3D, the four epitaxial SBD design depicted in FIG. 5, the linear SBD design of FIG. 6, and the non-linear design of FIG. 7, in accordance with one or more aspects of the present invention.

FIG. 9 depicts total loss vs. frequency curves 900 for conventional SBD 100 (FIG. 1; control SBD of FIG. 7), SBD 318 using design 3 of FIG. 5, a SBD using either the four epitaxial layer of FIG. 5 or the linear design described above, and a SBD using the non-linear, inverse square law design described above. Since the total loss curves for the four layer design and the linear design are approximately equivalent, they are shown as one curve in FIG. 9 (i.e., the four layer/linear design case). FIG. 9 shows that at frequencies greater than approximately 50 KHz, total losses for the novel SBD designs are less than the total loss of the prior art SBD. This reduction in total losses is due to a lower switching energy loss (Esw). The curves shown in FIG. 9 demonstrate the advantageous lowering of total loss when using SBD 318 for the high frequency applications (e.g., >150 KHz) for which SiC Schottky diodes are typically used (e.g., power supplies for computers). Similar total loss advantages are provided by SBD 500 (FIG. 5), or the linear or non-linear cases described above, and are shown in FIG. 9.

Figure 10:
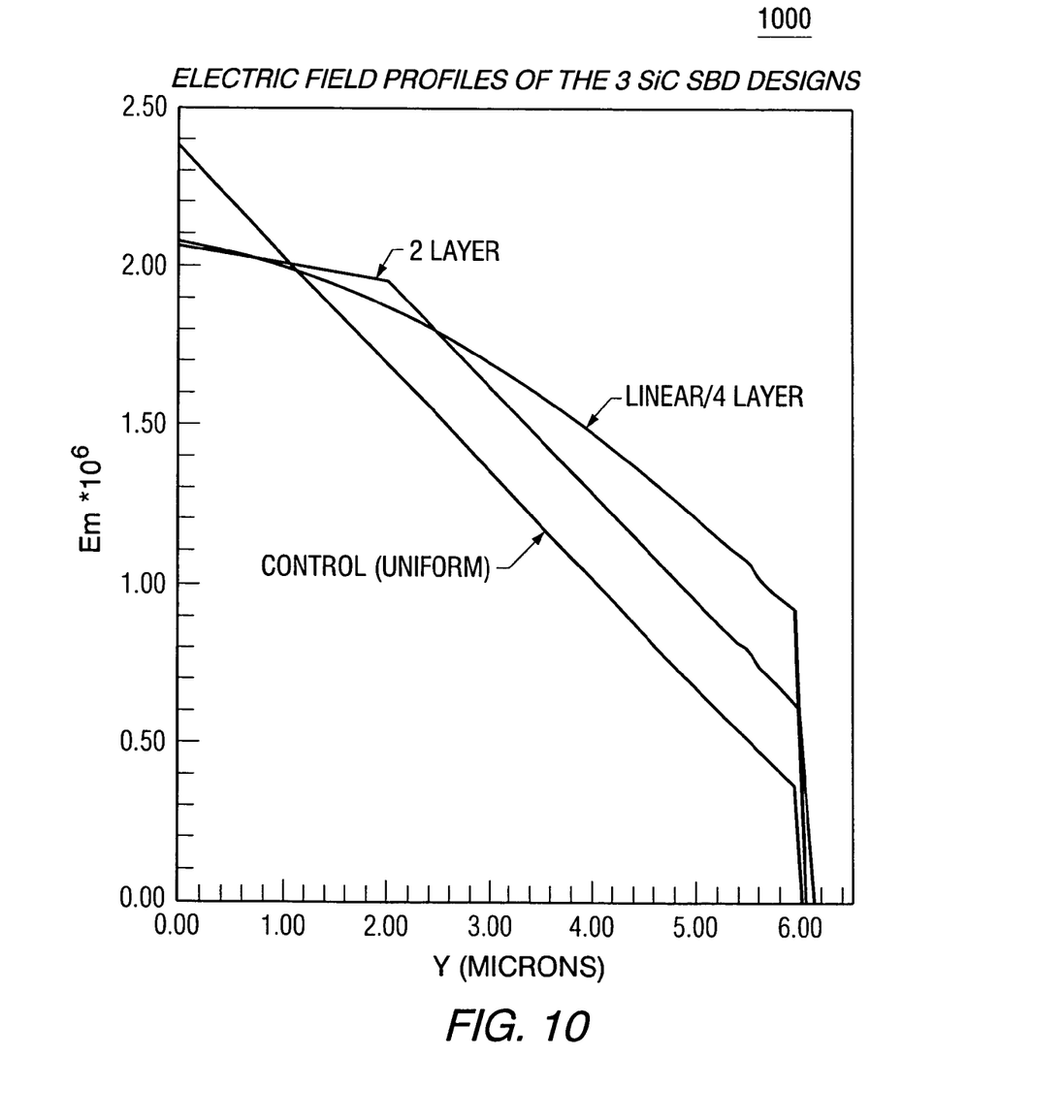
FIG. 10 depicts electric field profiles for the conventional one epitaxial layer SBD (FIG. 1), the two epitaxial layer SBD depicted in FIG. 3D, the linear SBD design of FIG. 6, and the four epitaxial layer SBD design depicted in FIG. 5, in accordance with one or more aspects of the present invention.

FIG. 10 depicts electric field profiles 1000 to compare the control case (SBD 100 of FIG. 1; control SBD of FIG. 7) to the two epitaxial layer case (SBD 318 of FIG. 3D), and to the linear and four layer cases (i.e., the linear case described above and the four epitaxial layer SBD of FIG. 5). These profiles 1000 map the changes in the electric field of the above-described SBD designs at various depths of the epitaxial layers up to the 6.00 micron thickness of the layers. Since the electric field profiles of the linear and four layer cases are approximately equivalent, they are shown as one curve in FIG. 10 (i.e., the linear/four layer case). In the two layer and the linear/four layer cases, the surface electric field (i.e., at 0.00 microns) is lower compared to the control case. Because of this lowering of the surface electric field, these novel SBD designs are associated with lower leakage currents and improved reliability.

Advantageously, the Schottky barrier diode having at least two epitaxial layers, wherein at least two of the epitaxial layers each supports a substantial portion of blocking voltage as described herein provides lower capacitance and reduced total losses (switching and conduction), while keeping negative effects on Ron and Vf low. Again, the lightly doped top epitaxial layer facilitates the reduced capacitance at low voltages, and the resulting reductions in reverse recovery losses in the diode and turn-on losses in the switch. Capacitive charge and peak reverse recovery current are also lowered with the novel SBD. By optimizing the thickness and doping of the at least two epitaxial layers supporting a substantial portion of blocking voltage, total losses can be minimized. The lower losses in the diode and switch of the SBD described herein also results in the device running cooler with increased reliability. Further, the structure of the novel SBD described herein allows die size or the heat sink of the diode to be reduced, thereby lowering production cost. In particular, the die size can be decreased for the same temperature performance. Still further, the novel SBD provides a lower surface electric field that results in lower leakage currents and improved reliability.

Although preferred embodiments have been depicted and described in detail herein, it will be apparent to those skilled in the relevant art that various modifications, additions, substitutions and the like can be made without departing from the spirit of the invention and these are therefore considered to be within the scope of the invention as defined in the following claims. For example, although the novel semiconductor device described herein is a SiC SBD, the semiconductor structure having at least two epitaxial layers, wherein at least two of those layers each support a substantial portion of the blocking voltage of the device, can also be implemented as a junction barrier controlled Schottky (JBS) diode, a PN diode, or a junction field effect transistor (JFET), a metal oxide semiconductor field effect transistor (MOSFET), or a static induction transistor (SIT). Further, the SBD structure described herein can employ other semiconductor materials, such as GaN, diamond, GaAs, and Si.

What is claimed is:

1. A semiconductor device comprising:
   a highly doped N-type silicon carbide (SiC) substrate;
   an N-type SiC first epitaxial layer disposed on said substrate, said first epitaxial layer having a first dopant concentration; and
   a lightly doped N-type SiC second epitaxial layer disposed on said first epitaxial layer having a second dopant concentration,
   wherein said second dopant concentration is less than said first dopant concentration, and
   wherein said first epitaxial layer and said second epitaxial layer each support a substantial portion of blocking voltage of the semiconductor device,
   such that the surface electric field of said device is reduced resulting in lower leakage currents, and such that the running temperature of said device is lower.

2. The semiconductor device of claim 1, wherein a dopant ratio of said first dopant concentration to said second dopant concentration is more than 1:1.

3. The semiconductor device of claim 2 wherein said dopant ratio is between approximately 2:1 and approximately 6:1.

4. The semiconductor device of claim 1, wherein the semiconductor device is selected from a group consisting of a Schottky barrier diode, a junction barrier controlled Schottky (JBS) diode, a PN diode, a junction field effect transistor (JFET), a metal oxide semiconductor field effect transistor (MOSFET), and a static induction transistor (SIT).

5. The semiconductor device of claim 1, wherein the semiconductor device further comprises a Schottky contact layer disposed on said second epitaxial layer.

6. The semiconductor device of claim 1, wherein dopant levels and thickness dimensions of said first epitaxial layer and said second epitaxial layer are selected to facilitate a reduction in capacitance and switching losses of said semiconductor device and to facilitate minimal effects on forward voltage and on-resistance of said semiconductor device.

7. A semiconductor device comprising:
   a highly doped N-type silicon carbide (SiC) substrate:
   an N-type SiC first epitaxial layer disposed on said substrate, said first epitaxial layer having a first dopant concentration: and
   a lightly doped N-type SiC second epitaxial layer disposed on said first epitaxial layer having a second dopant concentration,
   wherein said second dopant concentration is less than said first dopant concentration, and
   wherein said first epitaxial layer and said second epitaxial layer each support a substantial portion of blocking voltage of the semiconductor device, and
   wherein said second epitaxial layer is thinner than said first epitaxial layer.

8. A semiconductor device comprising:
   a highly doped N-type silicon carbide (SiC) substrate:
   an N-type SiC first epitaxial layer disposed on said substrate, said first epitaxial layer having a first dopant concentration: and a lightly doped N-type SiC second epitaxial layer disposed on said first epitaxial layer having a second dopant concentration, wherein said second dopant concentration is less than said first dopant concentration, and wherein said first epitaxial layer and said second epitaxial layer each support a substantial portion of blocking voltage of the semiconductor device, and wherein said first epitaxial layer has a first thickness and said second epitaxial layer has a second thickness, and wherein a thickness ratio of the first thickness to the second thickness is at least approximately 2:1.

9. The semiconductor device of claim 8, wherein said thickness ratio is between approximately 2:1 and approximately 5:1.

10. The semiconductor device of claim 8, wherein said thickness ratio is at least 5:1.

11. A semiconductor device comprising:

a highly doped N-type silicon carbide (SiC) substrate:

an N-type SiC first epitaxial layer disposed on said substrate, said first epitaxial layer having a first dopant concentration: and a lightly doped N-type SiC second epitaxial layer disposed on said first epitaxial layer having a second dopant concentration, wherein said second dopant concentration is less than said first dopant concentration, and wherein said first epitaxial layer and said second epitaxial layer each support a substantial portion of blocking voltage of the semiconductor device, and wherein a dopant ratio of said first dopant concentration to said second dopant concentration is at least approximately 6:1.

12. A semiconductor device comprising:

a highly doped N-type SiC substrate;

an N-type SiC bottom epitaxial layer disposed on said substrate, said bottom epitaxial layer having a first dopant concentration;

one or more N-type SiC inter mediate layers positioned superior to said substrate, wherein one layer of the one or more intermediate epitaxial layers is an upper layer and one layer of the one or more intermediate epitaxial layers is a lower layer, said upper layer is an intermediate epitaxial layer positioned furthest from said substrate and said lower layer is an intermediate epitaxial layer disposed on said substrate; and an N-type SiC top epitaxial layer disposed on said upper layer of the one or more intermediate layers, said top epitaxial layer having a second dopant concentration, wherein at least two epitaxial layers each support a substantial portion of blocking voltage of the semiconductor device, and wherein said second dopant concentration is less than said first dopant concentration and less than the dopant concentrations of said one or more intermediate epitaxial layers.

13. The semiconductor device of claim 12, wherein a dopant ratio of said first dopant concentration to said second dopant concentration is more than 1:1.

14. The semiconductor device of claim 13 wherein said dopant ratio is between approximately 2:1 and approximately 6:1.

15. The semiconductor device of claim 13 wherein said dopant ratio is at least approximately 6:1.

16. The semiconductor device of claim 12, wherein the semiconductor device is selected from a group consisting of a Schottky barrier diode, a JBS diode, a PN diode, a JFET, a MOSFET, and a SIT.

17. The semiconductor device of claim 12, wherein the semiconductor device further comprises a Schottky contact layer disposed on said second epitaxial layer.

18. the semiconductor device of claim 12, wherein dopant levels and thickness dimensions of said epitaxial layers are selected to facilitate a reduction in capacitance and switching losses of said semiconductor device and to facilitate minimal effects on forward voltage and on-resistance of said semiconductor device.

19. The semiconductor device of claim 12, wherein said first dopant concentration is more than each dopant concentration of said dopant concentrations of said one or more intermediate epitaxial layers.

20. The semiconductor device of claim 19, wherein said dopant concentrations of said one or more intermediate epitaxial layers vary according to a distance from said substrate, and if said first intermediate epitaxial layer is at a greater distance from said substrate than a second intermediate epitaxial layer, said first intermediate epitaxial layer has a lighter dopant concentration than said second intermediate epitaxial layer.

21. A semiconductor device comprising:

a highly doped N-type SiC substrate; and an N-type SiC epitaxial layer disposed on said substrate, said epitaxial layer having a continuously graded dopant concentration that varies according to a distance from said substrate, wherein said dopant concentration varies from a lowest concentration at a distance furthest from said substrate to a highest concentration at a distance closest to said substrate, such that the surface electric field of said device is reduced resulting in lower leakage currents, and such that the running temperature of said device is lower.

22. The semiconductor device of claim 21, wherein said dopant concentration varies non-linearly from said lowest concentration to said highest concentration.

23. The semiconductor device of claim 21, wherein a dopant ratio of said highest concentration to said lowest concentration is greater than 1:1.

24. The semiconductor device of claim 23, wherein said dopant ratio is between approximately 2:1 and approximately 6:1.

25. A semiconductor device comprising:

a highly doped N-type SiC substrate; and an N-type SiC epitaxial layer disposed on said substrate, said epitaxial layer having a continuously graded dopant concentration that varies according to a distance from said substrate, wherein said dopant concentration varies from a lowest concentration at a distance furthest from said substrate to a highest concentration at a distance closest to said substrate:

wherein said dopant concentration varies linearly from said lowest concentration to said highest concentration.

26. A semiconductor device comprising;

a highly doped N-type SiC substrate; and an N-type SiC epitaxial layer disposed on said substrate, said epitaxial layer having a continuously graded dopant concentration that varies according to a distance from said substrate, wherein said dopant concentration varies from a lowest concentration at a distance furthest from said substrate to a highest concentration at a distance closest to said substrate, wherein said dopant concentration varies inversely with the square of said distance from said substrate.

27. A semiconductor device comprising:

a highly doped N-type SiC substrate; and an N-type SiC epitaxial layer disposed on said substrate, said epitaxial layer having a continuously graded dopant concentration that varies according to a distance from said substrate, wherein said dopant concentration varies from a lowest concentration at a distance furthest from said substrate to a highest concentration at a distance closest to said substrate, wherein a dopant ratio of said highest concentration to said lowest concentration is at least approximately 6:1.

* * * * *

UNITED STATES PATENT AND TRADEMARK OFFICE
CERTIFICATE OF CORRECTION

| | |
|---|---|
| PATENT NO. | : 7,199,442 B2 |
| APPLICATION NO. | : 10/893764 |
| DATED | : April 3, 2007 |
| INVENTOR(S) | : Praveen M. Shenoy et al. |

It is certified that error appears in the above-identified patent and that said Letters Patent is hereby corrected as shown below:

ON THE TITLE PAGE: ITEM 75 SHOULD READ

Praveen M. Shenoy, Wilkes Barre, PA (US); Etan Shacham, Cupertino, CA (US)

Signed and Sealed this

Seventeenth Day of March, 2015

Michelle K. Lee
*Director of the United States Patent and Trademark Office*